United States Patent [19]

Horak et al.

[11] Patent Number: 4,924,468
[45] Date of Patent: May 8, 1990

[54] LOGIC ANALYZER

[75] Inventors: Dieter K. Horak, Moosburg; Rudolf Wieczorek, Munich, both of Fed. Rep. of Germany

[73] Assignee: Kontron Holding AG, Zurich, Switzerland

[21] Appl. No.: 272,158

[22] Filed: Nov. 16, 1988

[30] Foreign Application Priority Data

Nov. 30, 1987 [CH] Switzerland .................. 4655/87

[51] Int. Cl.$^5$ ........................................... G01R 31/28
[52] U.S. Cl. ................................................. 371/22.1
[58] Field of Search ................ 371/22.1, 15.1, 16.1, 371/29.1, 25.1; 324/73 R, 73 AT; 364/200, 900, 551, 481

[56] References Cited

U.S. PATENT DOCUMENTS

| | | | |
|---|---|---|---|
| 4,425,643 | 1/1984 | Chapman | 371/22.1 |
| 4,558,422 | 12/1985 | Denbeste | 364/179 X |
| 4,697,138 | 9/1987 | Morishita et al. | 324/73 R |
| 4,730,314 | 3/1988 | Noguchi | 371/22.1 |
| 4,788,492 | 11/1988 | Schubert | 324/73 R |

FOREIGN PATENT DOCUMENTS 181619 11/1985 European Pat. Off. .
3611873 9/1986 Fed. Rep. of Germany .

OTHER PUBLICATIONS

Patent Abstract of Japanese Kokai 284668/1986 and partial translation.
Hewlett–Packard Journal, Ible et al., "High Speed Data Analyzer Tests Threshold and Timing Parameters", pp. 14–25 (Jul. 1983).

Primary Examiner—Jerry Smith
Assistant Examiner—Robert W. Beausoliel
Attorney, Agent, or Firm—Evenson, Wands Edwards, Lenahan & McKeown

[57] ABSTRACT

A logic analyzer for measuring logic signals which are delivered by a number of targets and which are not correlated in time. To incorporate the actual time features and relationships between the data signals of various targets the logic analyzer has at least one acquisition module which can be connected to an associated target or data source. The acquisition modules have various circuit arrangements which choose between the system's internal constant-frequency, or the external target generated, clock signal for a sampling signal, and then samples and synchronizes the time uncorrelated data signals. The data signals are then compared with predetermined patterns and coincidence is indicated.

8 Claims, 9 Drawing Sheets

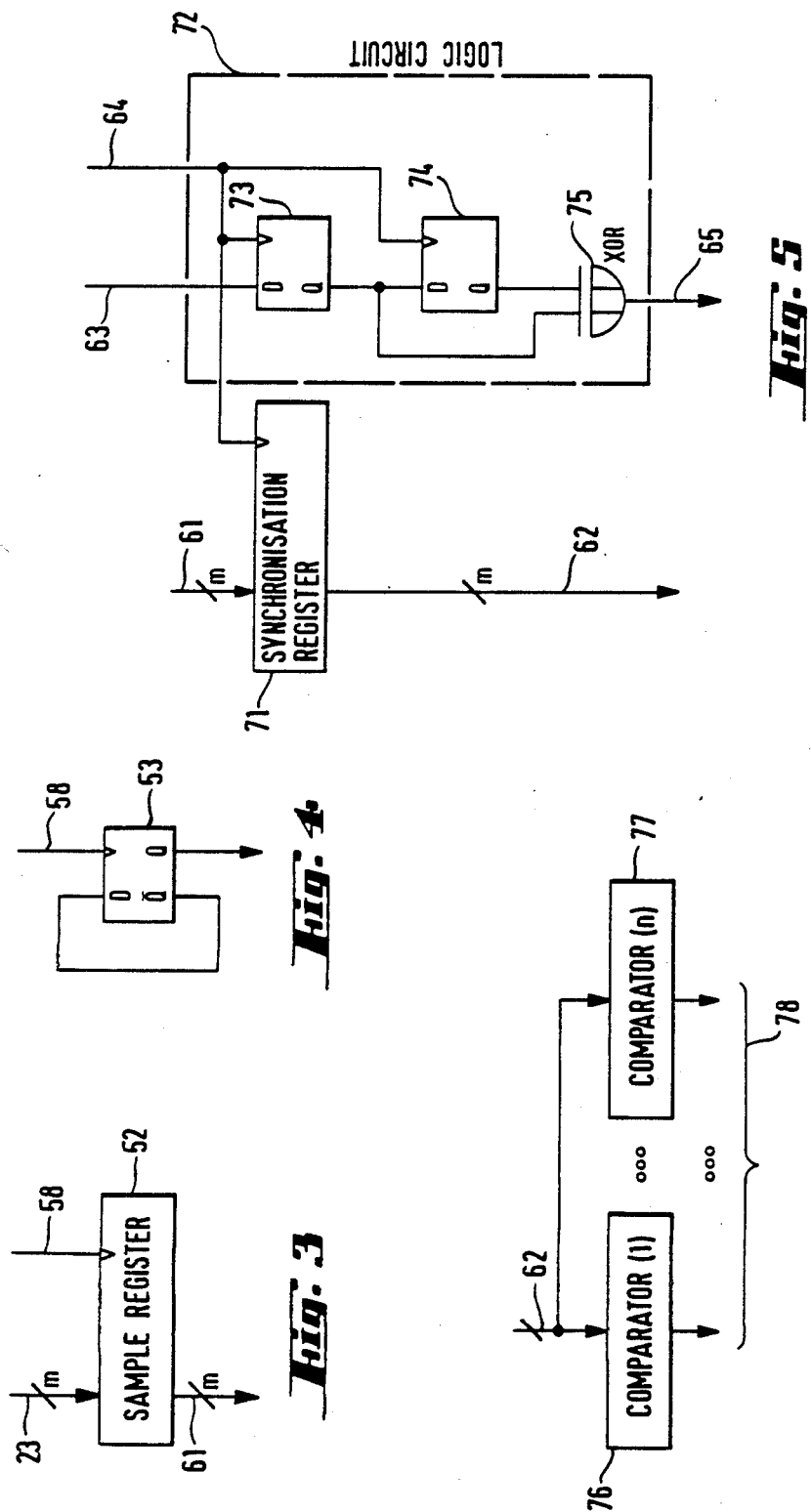

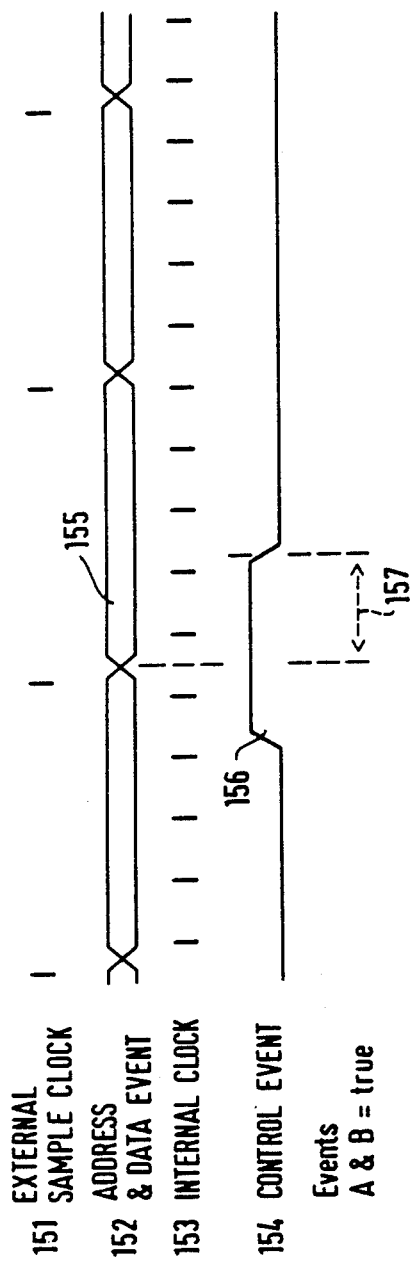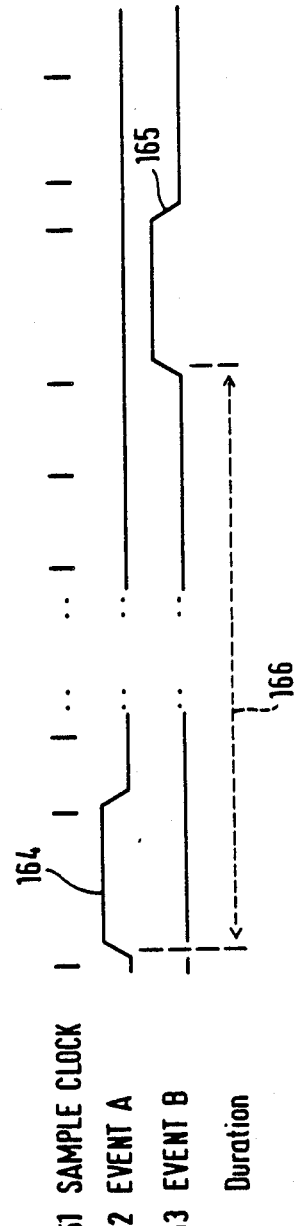

LOGIC ANALYZER

BACKGROUND OF THE INVENTION

1. Field of the Invention

The present invention relates to a logic analyzer for measuring logic signals, more particularly for measuring data signals delivered by a number of targets which are uncorrelated in time.

2. Description of the Prior Art

Digital electronic devices comprise microprocessors which co-operate and implement complex functions. Appropriate measuring instruments are needed to develop, calibrate and test such devices.

The accompanying FIG. 1 shows the construction of a conventional logic analyzer 14. Such conventional analyzers have a clock selector 15 which selects, and delivers at its output either an external clock signal derived from a target 11 and supplied to the analyzer by way of a line 12, or an internal clock signal delivered by a clock signal generator 16. The analyzer also contains a data memory 17 for the purpose of storing data signals which are delivered from the target 11 by way of data lines 13.

The data signals are sampled by means of the clock signal at the clock selector output. Storage of data signals in the memory 17 is stopped by a trigger control 18 when a predetermined trigger condition has been fulfilled. An evaluator 19 contains a data processor and an input/output unit, and operates to evaluate the stored data signals, to input instructions and to display the required representation of the stored data signals.

These known logic analyzers can measure only data signals of discrete targets, for example discrete microprocessors, with the trigger control being unable to take into account time relationships between the data signals of different targets.

A known logic analyzer (EP-AO 181 619) embodies both a first analyzer section and a second analyzer section The first analyzer section can be used, for example, to make a state analysis of a first block of data signals. The second analyzer section is used, for example, to make a time analysis of a second block of data signals. The first analyzer section has both a time measurement circuit which detects the time intervals of all the samplings in the first analyzer section, and a time interval memory in which the measured intervals are stored. This analyzer also has a time difference measurement circuit for measuring, and a time difference memory for storing, the time interval between the end of recording in the first analyzer section and the end of recording in the second analyzer section.

On the basis of the values stored in the time interval memory and time difference memory the post-triggering processing of the recorded data signals makes it possible to produce a time-correlated representation of the data signals recorded by the first and second analyzer sections. However, this is possible only for two analyzer sections—i.e., only for two different blocks of data signals. In this known logic analyzer the time relationship between the measured data signals cannot also be taken into account for the trigger control.

The testing or examination of complex digital systems, usually involves a number of co-operating microprocessors. It is desirable to use the actual duration of time-uncorrelated data or word zones in data signals derived from a number of different microprocessors—i.e., different targets, and/or the actual time interval between such data or word zones as a criterion for trigger and recording control.

It is an object of the present invention to provide a logic analyzer which uses the actual timing of time uncorrelated data as such control criterion.

SUMMARY OF THE INVENTION

The logic analyzer according to the present invention has at least one acquisition module which can be connected to an associated target and contains circuit arrangements consisting of: a clock selector, a sample register, a sample detector, a synchronizing circuit, an event detector, a memory control and a data memory.

The clock selector allows the selection either of an internal clock signal of constant period and frequency or of an external clock signal derived from the target. The selected clock signal appears at the output of the clock selector as the sample clock signal.

The sample register stores data signals delivered by the target and sampled by the sample clock signal.

The sample detector responds to the sample clock signal by delivering for each sampling as output signal a sample signal identifying the instant of time of sampling.

The synchronization circuit contains a synchronization register and a logic circuit. The synchronizing register stores data signals which are read out of the sample register in response to the sample clock signal, and are sampled by the internal clock signal. The logic circuit responds to the internal clock signal, and to the sample signal, by deriving sample marking pulses each marking the instant of time of a sampling.

The event detector compares data signals read out of the synchronization register of the synchronization circuit with a predetermined pattern, and in the event of coincidence delivers an output signal corresponding to an event.

The memory control provides a logic link between control signals delivered by a trigger control, one or more output signals of the event detector and one or more sample marking pulses. The memory control produces as an output signal a recording marking pulse. This pulse causes the storage of data signals which are read out of the synchronization register in response to the internal timing signal and whose time position is marked by a corresponding sample marking pulse. The data memory is controlled by the memory control, and operates to store data signals read out of the synchronization register.

The present invention makes it possible in logic analyzers to use as a criterion for trigger control and recording control the actual duration of time-uncorrelated data or word zones from a number of different targets, for example microprocessors, and/or the actual time interval between such zones. This is irrespective of whether the data signals, which are delivered by each target and supplied to the inputs of the logic analyzer, are sampled by an external clock signal derived from the clock signal of the target or by an internal constant clock signal of the analyzer. These advantages apply even where the present invention is used in the analysis of data signals of a number of targets whose clock signals have an unknown frequency and when the time relationship between such clock signals is unknown.

BRIEF DESCRIPTION OF THE DRAWINGS

FIG. 3 is a block schematic diagram of a sample register shown in FIG. 2, FIG. 4 shows an embodiment of the sample detector shown in FIG. 2, FIG. 5 shows an embodiment of the synchronization circuit shown in FIG. 2, FIG. 6 is a block schematic diagram of the event detector shown in FIG. 2, FIG. 12 is a signal diagram illustrating the simultaneous use of different targets in one trigger control, FIG. 13 is a signal diagram illustrating the measurement of the intervals between events during a recording made with an external target-derived clock signal of unknown frequency.

DETAILED DESCRIPTION OF THE PREFERRED EMBODIMENTS

Figure 1:
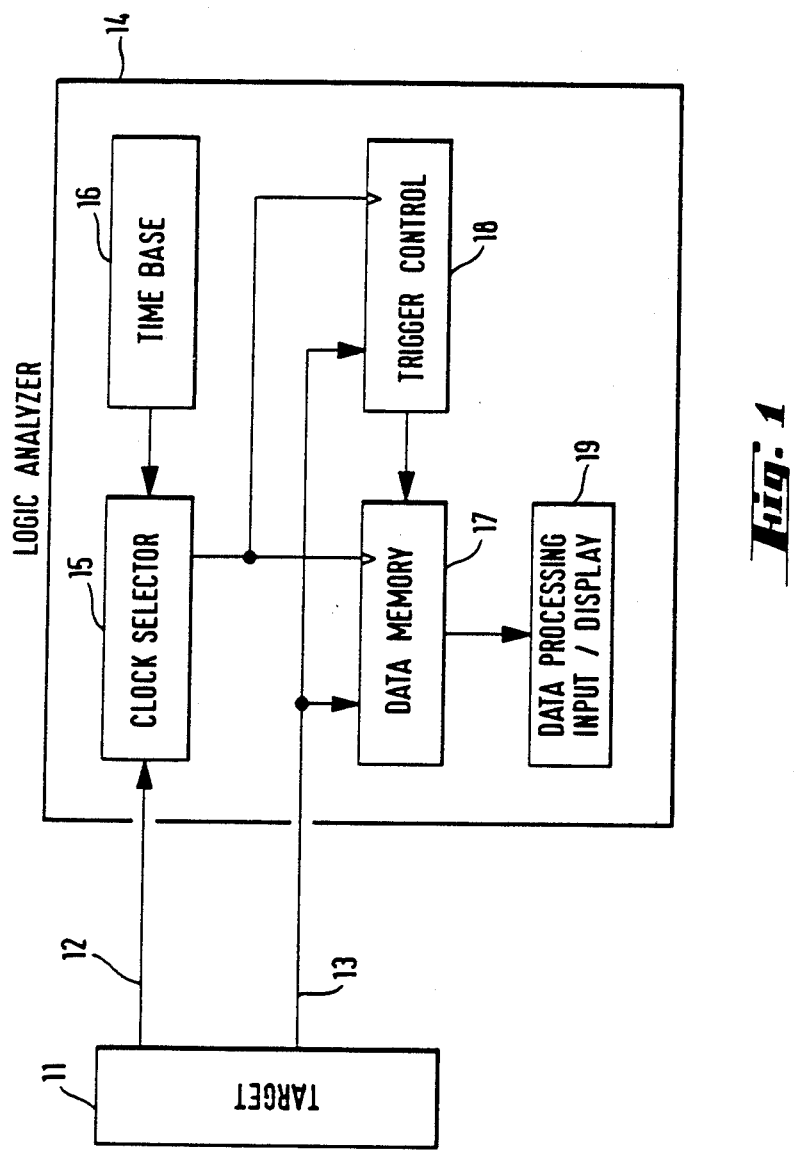
FIG. 1 is a block schematic diagram of a conventional logic analyzer.
Figure 2:
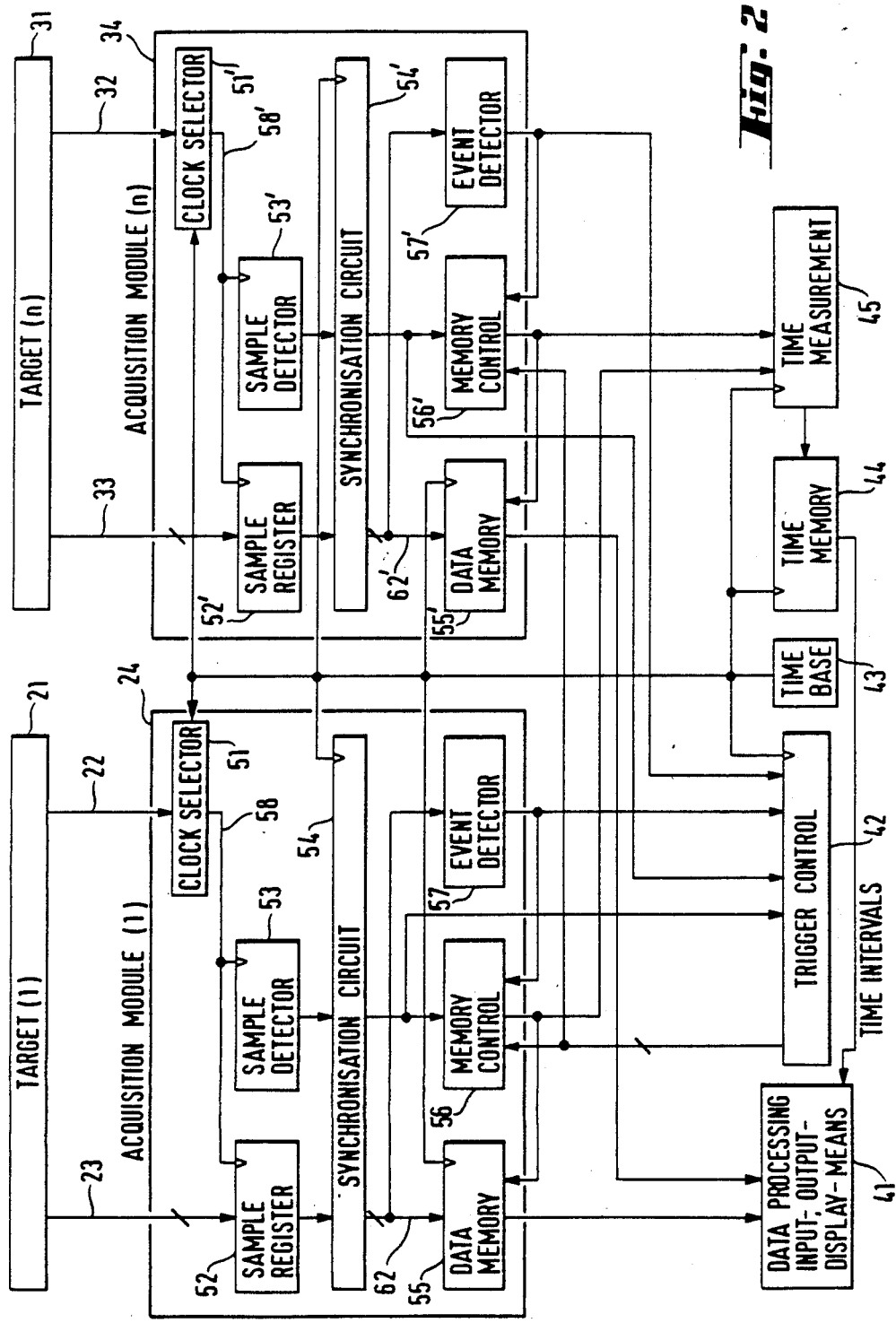
FIG. 2 is a block schematic diagram of a logic analyzer according to the present invention.

FIG. 2 shows a preferred embodiment of a logic analyzer according to the present invention. Although this embodiment comprises a number of acquisition modules 24, 34 adapted to measure data signals from a corresponding number of targets 21, 31, the main advantages of the analyzer according to the invention can also be obtained when even a single acquisition module is used to measure the data signals of a single target. To simplify the illustration only a first acquisition module 24 and a second acquisition module 34 are shown in FIG. 2. Theoretically however, n such modules can be provided, n being equal to or greater than one.

As shown by FIG. 2, an acquisition module is associated with each target; i.e. module 24 is associated with target 21 and module 34 with target 31. Each acquisition module receives from its associated target data signals and a clock signal. The data signals ar transmitted by way of a number of lines 23, 33 respectively and the clock signals by way of lines 22, 32 respectively.

The analyzer of FIG. 2 also comprises an internal clock signal generator 43, a trigger control 42, a time interval measurement circuit 45, a time interval memory 44 and an evaluator 41, the latter comprising a data processor and an input/output unit. The clock signal generator 43 produces an internal clock signal of constant frequency. All of the internal function units of the logic analyzer operate on this internal clock signal.

Since all the acquisition modules 24, 34 etc. have the same construction and operate in the same way, a detailed description will be given only of the module 24. All like acquisition modules have similar references in FIG. 2; for example the clock selectors have the references 51 and 51'.

Module 24 comprises a clock selector 51, a sample register 52, a sample detector 53, a synchronization circuit 54, a data memory 55, a memory control 56 and an event detector 57. Clock selector 51 may be embodied by a programmable demultiplexer which enables the selection either of the constant frequency internal clock signal delivered by the clock signal generator 43 or of an external clock signal derived from the target 21 and transmitted by way of the line 22. The selected clock signal is output by the selector 51 as the sample clock signal. For asynchronous sampling (timing analyzer mode) the internal clock signal produced by the generator 43 is used. For synchronous sampling (state analyzer mode) an external clock signal derived from the target is used.

As FIG. 3 shows, data signals arriving from the target 21 by way of m lines 23 are sampled by the sample clock signal delivered from the output of selector 51 by way of a line 58. The data signals are then passed on as sampled data signals by way of m lines 61 to the synchronization register. The sample detector 53 responds to the sample clock signal, delivered from the output of the clock selector 51 by way of line 58, by delivering as output signal for each sampling a sample signal whose polarity changes at the instant of sampling and therefore makes such instant of time identifiable. As shown in FIG. 4, the sample detector 53 may be embodied by a D flip-flop.

FIG. 5 shows an embodiment of the synchronization circuit 54. This embodiment comprises a synchronization register 71 and a logic circuit 72. The logic circuit has the arrangement, shown in FIG. 5, of D flip-flops 73, 74 and an exclusive-or gate. The internal clock signal from generator 43 is supplied by way of a line 64 to the clock inputs of register 71 and D flip-flops 73, 74. The sampled data signal delivered by the sample register 52 are sampled in the synchronization register 71 by the internal clock signal from generator 43 and delivered as synchronized data signals by way of lines 62. In the logic circuit 72 the sample signal delivered by the sample detector 53, and supplied by way of a line 63 to the D-input of D flip-flop 73, is also sampled by the internal clock signal. A sample marking pulse corresponding to the sample signal, and thus to the time of sampling, is therefore produced at the output of the logic circuit 72.

As shown in FIG. 6, the event detector 57 comprises a number of comparators 76, 77 etc. which compare user-programmable patterns with the data signals transmitted by way of the lines 62 and in the event of coincidence deliver by way of lines 78 output signals corresponding to events.

The memory control 56 provides a logic linking of several control signals. One may be delivered by a trigger control 42 common to a number of acquisition modules 24, 34, etc. Other control signals may be one or more output signals of the event detector 57 and one or more sample marking pulses. The memory control 56 links these signals in order to produce as an output signal a recording marking pulse which is transmitted by way of a line 66. This pulse causes to be stored in the data memory 55 data signals which are read out of the synchronization register 71 in response to the internal clock signal and whose time position is marked by a corresponding sample marking pulse.

Figure 8:
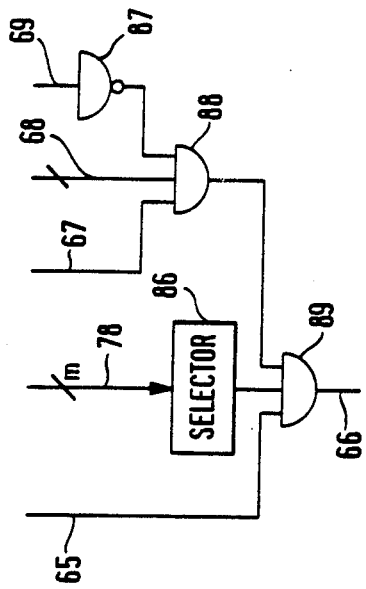
FIG. 8 is a block schematic diagram of the memory control shown in FIG. 2.

FIG. 8 shows one form of the memory control 56. This circuit contains an inverter 87, and-gates 88, 89 and a programmable selector 86. The memory control 56 receives as input signals sample marking pulses by way of the line 65, output signals of the event detector 57 by way of lines 78 and control signals (ENABLE, START, STOP) delivered by the trigger control 42 by way of lines 67–69. By a programmable linking of these input signals the memory control 56 produces recording marking pulses which are delivered at the output of and-gate 89 to line 66.

The data memory 55 inputs the synchronized data signals, delivered by way of line 62 from the output of register 71 of synchronization circuit 54, when a recording marking pulse is present at the instant of the occurrence of an internal clock signal. After the termination of a measurement the data stored in the data memory 55 is read out by the evaluator 41 as acquired data signals.

Figure 7:
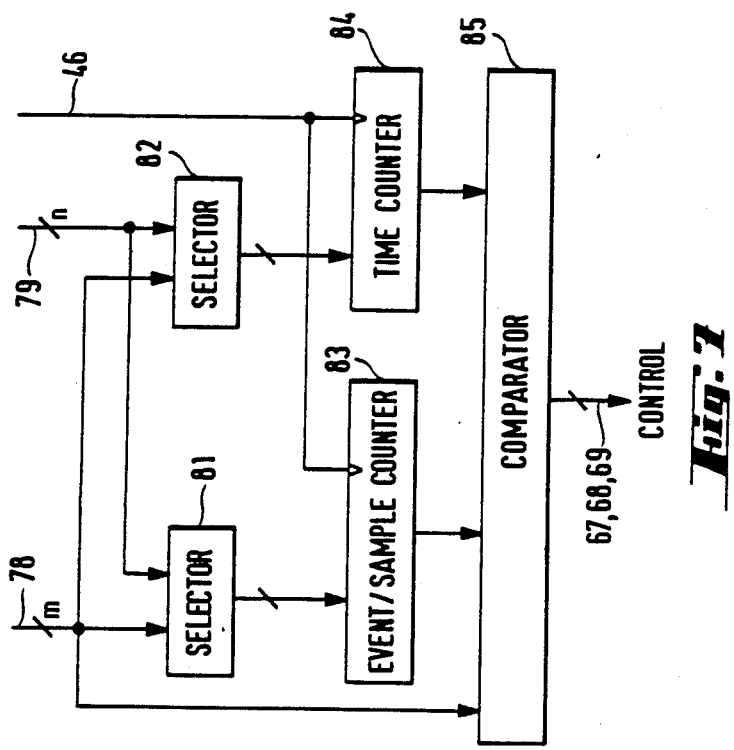
FIG. 7 is a block schematic diagram of the trigger control shown in FIG. 2.

FIG. 7 shows one form of the trigger control 42 of FIG. 2. The circuit 42 comprises programmable selectors 81, 82, an event-sampling counter 83, a timer counter 84 and a digital comparator 85. The trigger control 42 receives the following input signals: output signals of the event detector 57 which correspond to one or more events by way of lines 78, one or more sample marking pulses by way of lines 79 and the internal clock signal supplied to the clock input of counters 83, 84 by way of line 46. In response to appropriate input signals the selector 81 transmits enabling or resetting pulses to the counter 83 and the selector 82 transmits resetting pulses to the counter 84. The trigger control 42 produces control signals by counting signals corresponding to events, sample marking pulses and impulses of the internal clock signal and by comparing the resulting counter states with user-programmed values. The control signals produced by the trigger control 42 consist of start, stop and enable signals. These signals are delivered at the output of the comparator 85, and by way of corresponding lines 67, 68, 69, are supplied to the memory control 56.

Figure 9:
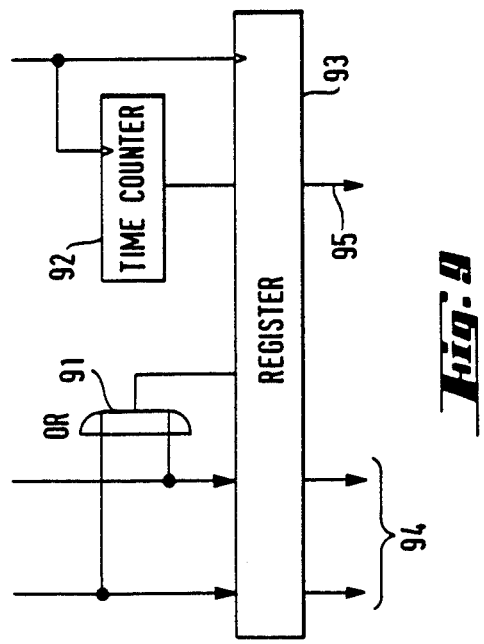
FIG. 9 is a block schematic diagram of the time measurement circuit shown in FIG. 2.

FIG. 9 shows an exemplary time measurement circuit 45. It comprises an or-gate 91, a time counter 92 and a register 93. The circuit 45 measures, by means of a counter 92 which increments with the internal clock signal, the time intervals between the recording marking pulses which are supplied to the inputs of the or-gate 91. These pulses can occur in any sequence and can arrive from various acquisition modules. When the recording marking pulse occurs, the circuit 45 stores such pulse and the time interval in the register 93. These signals can be read by way of corresponding output lines 94, 95 respectively.

Every time-interval measured by the circuit 45 and the recording marking pulse which has ended a time-interval is stored in the memory 44 after the occurrence of an interval end. This stored data is read out by the evaluator 41.

Figure 10:
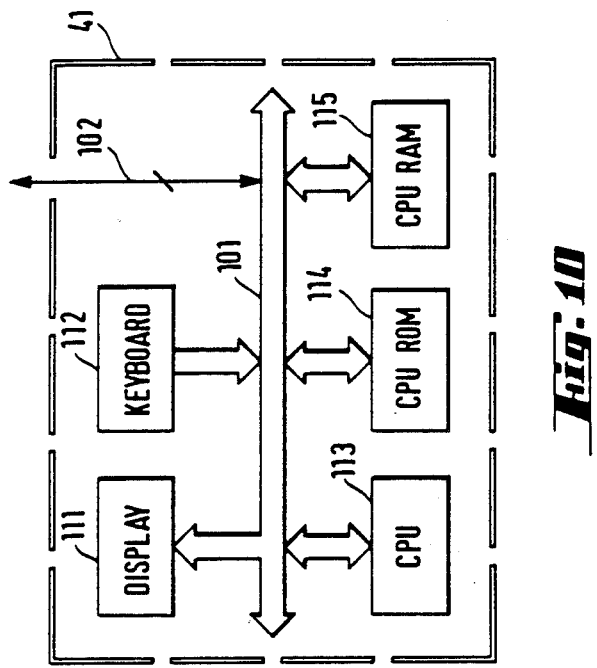
FIG. 10 is a block schematic diagram of the evaluator (or data processing input/output display means) shown in FIG. 2.

FIG. 10 illustrates one form of the evaluator 41. It comprises a central processor unit 113, a read-only-memory (ROM) 114, a random access memory (RAM) 115, a keyboard 112 and a display unit 111. These components are interconnected via a bus line 101. Evaluator 41 is connected by way of lines 102, to the data memories 55, 55' etc. of the acquisition modules and to the time memory 44.

The evaluator 41 reads the values stored in both the data memories 55 of the various acquisition modules and in the time memory 44, and makes it possible to put them to use. For example, to display the data signals from a number of acquisition modules in the correct time sequence and at the correct time interval on a display screen in any coding.

In another embodiment of the present invention, the time measurement circuit 45 stores not the time intervals between recording marking pulses, but the absolute time since the beginning of a measurement when a recording marking pulse occurs. The end of a measured time interval is therefore marked also. This embodiment considerably facilitates subsequent evaluation of the data signals.

In another embodiment of the present invention, each acquisition module has its own time measurement circuit and its own time interval memory so it can also measure and store absolute times. In this embodiment, therefore, the time measurement circuit 45 and the time interval memory 44 shown in FIG. 2 and common to a number of acquisition modules are unnecessary. All the time measurement circuits are started simultaneously at the beginning of a measurement. Consequently, a common time scale is also defined in this case.

As shown in FIG. 2, internal processing of the scanned data signals at the output of the sample register 52 is affected in a synchronous architecture operated with a constant internal clock. According to the invention, therefore, a two-stage sampling method may be used. This method will now be described with reference to the block schematic diagram in FIG. 2 and to the signal diagrams shown in FIG. 11.

Figure 11:
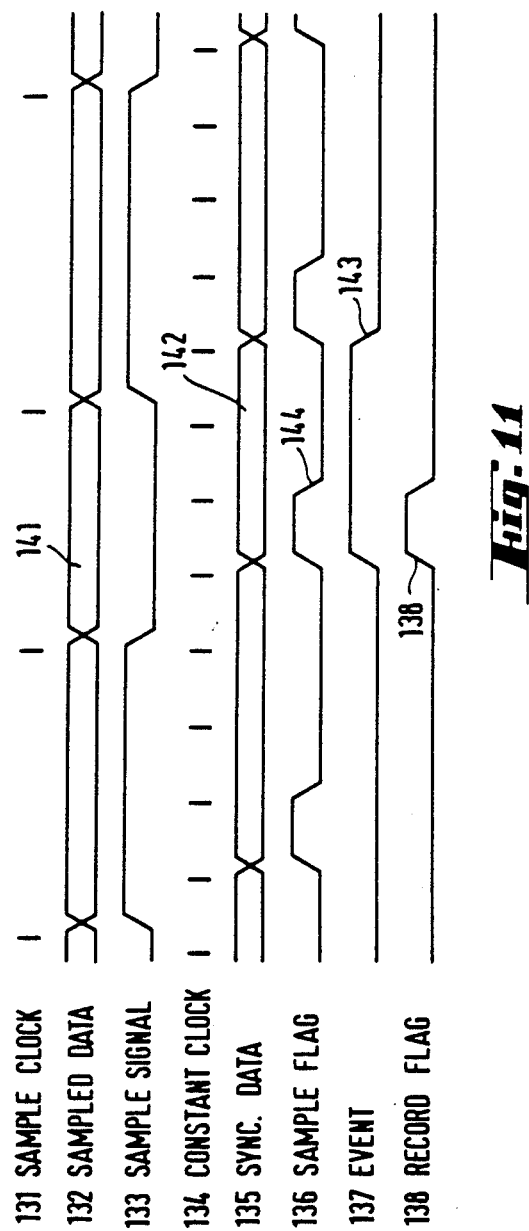
FIG. 11 is a signal diagram illustrating the two-stage sampling method used by the block schematic diagram shown in FIG. 2.

FIG. 11 illustrates an embodiment wherein the data signals are sampled by an external target-derived clock signal and read into the sample register 52. Here, the event detector 57 is programmed to seek a pattern which occurs in a block 141 of data signals, "data n," and possibly produces a corresponding output signal 137 in which a pulse 143 corresponds to an "event n." The memory control 56 is programmed so that the data signal block 142 delivered by the synchronization circuit 54 is read into the data memory 55 only when an "event n" is present. To this end a recording marking pulse 138 is derived from a sample marking pulse 144 only when a pulse 143 corresponding to the "event n" is present.

The data signals received from the target 21 are sampled by the sample clock signal selected in the selector 51, and loaded into the sample register 52. FIG. 11 uses sampling by an external clock signal 131 derived from the target. The sample signal 133 delivered at the output of the sample detector 53 reverses polarity at each sampling, whereafter the data signals 132 stored in the sample register 52, together with the sample signal 133 in the synchronization circuit 54, are re-sampled by the internal clock signal and thus synchronized therewith for all further processing. A sample marking pulse having a length of one internal clock period is produced from the sample signal 133 for each polarity reversal. Wave shape 136 in FIG. 11 shows a number of such marking pulses, which are called also "sample flags." The sample marking pulses 136 are evaluated in parallel with the synchronized data signals 135 in the subsequent processing stages, viz., the memory control 56 and trigger control 42. The sample-marking pulses deliver to these processing stages such time information about the time of each sampling as was lost due to synchronization.

When a recording-marking pulse, also called a "record flag," is produced in the memory control 56 from a sample-marking pulse, the synchronized data signals 135 are transferred to the data memory 55.

The time interval between the occurrence of the recording-marking pulses of all the acquisition modules 24, 34 etc. is measured in the time measurement circuit 45. Such time intervals, and each of the recording-marking pulses occurring, are stored in the time memory 44. This data enables the time relationships between the data signals acquired by different acquisition modules to be reconstructed and displayed with correct timing—i.e. in absolute times in the evaluator 41.

The two-stage scanning method according to the present invention, as described in the foregoing, also makes it possible to identify and process data of targets in an asynchronous relationship to one another with no master clock definition being necessary. It is possible for trigger words to be defined (by means of the internal processing by an internal constant-frequency clock signal) over the whole width of the channels of all the targets. With the two-stage scanning method it is also possible to have processing times which are always of the same length in all acquisition modules irrespective of the frequency of the clock signals supplied to the sample register. This makes it possible to drive other appliances accurately (real time coupling of, for example, emulators, work generators, oscilloscopes, etc).

Another advantage of the two-stage method according to the present invention is that no filed data word is lost since no external clock is required to fill or empty other registers.

Other advantageous technical effects provided by the logic analyzer according to the present invention are illustrated by the signal diagrams in FIGS. 12-16.

As shown in FIG. 12, the data and address signals 152 of a processor are recorded in a first acquisition module with the use of an external processor-derived clock signal 151. Its control signals 154, however, are recorded in a second acquisition module with an internal clock signal 153 which is in an asynchronous relationship to the external clock signal. The recording is terminated by triggering when events 155, 156 occur simultaneously, such events being defined beforehand by the user and being derived from the data and address signals or from the control signals. Referring to FIG. 12, the two events 155, 156 are simultaneously present over a time interval 157.

This figure shows that the invention makes possible simultaneous use of events of a number of different targets in one trigger control, the target-delivered signals being sampled to some extent by an external clock and to some extent by an internal clock. This simultaneous use of events is also feasible when the target-delivered signals are each sampled by an external clock signal derived from the particular target concerned and of unknown frequency even when the various external clock signals are in an asynchronous relationship to one another.

This effect provides an advantage over the prior art. In the known logic analyzers the clock signal of the trigger control must be derived from the clock signal of the particular target concerned in order to use events in various data signals recorded with clock signals which are in an asynchronous relationship to one another. The prior are permits only sequential but not simultaneous use of events for trigger control.

As shown by FIG. 13, the logic analyzer according to the present invention supervises the implementation time of a program whose beginning is marked, for example, by the event 164 and whose end is marked by the event 165. To this end, data signals in which the events 164, 165 occur are sampled by an external target-derived clock signal 161 of unknown frequency. The recording of these signals is terminated by a triggering when the measured time interval 166 overshoots or undershoots a user-defined time interval.

This figure shows that, in the present invention, time intervals between events can be measured during a recording made with an external target-derived clock signal of unknown frequency, and then used in a trigger control. In the known logic analyzers such time intervals can be measured only when the data signals are recorded with an internal clock signal of known frequency.

Figure 14:
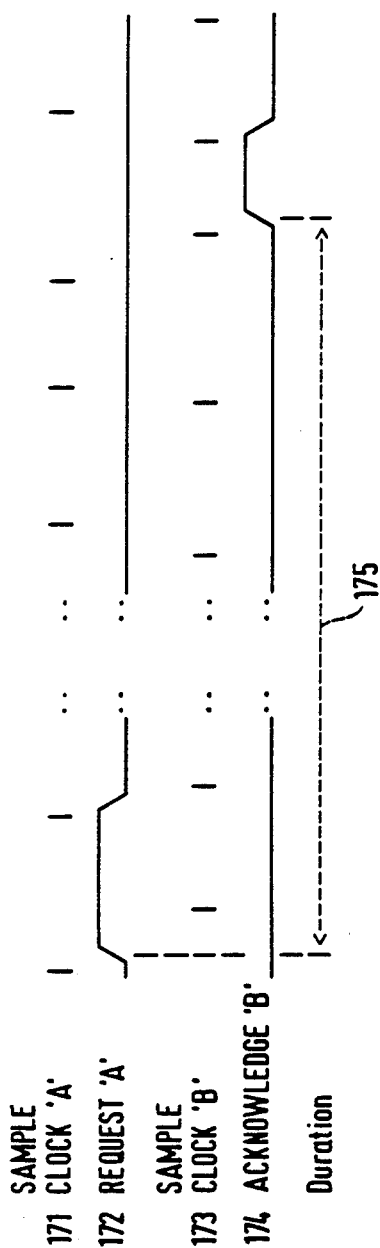
FIG. 14 is a signal diagram illustrating the use of measured time intervals in a trigger control even with asynchronous external clock signals.

As shown by FIG. 14, the logic analyzer according to the present invention may be used in the implementation of a multiprocessor system. The analyzer records signal patterns corresponding to the access of a first processor A to the bus of a second processor B in such a multiprocessor system. Processor A outputs a request signal 172 to request control of the bus from processor B. Processor B transfers control with an acknowledgment signal 174. The request signal 172 from processor A is sampled with an external clock signal 171 derived from processor A. The acknowledgment signal 174 from processor B is sampled with an external clock signal 173 derived from processor B. The clock signals 171, 173 are asynchronous relatively to one another. The recording of the signal patterns corresponding to the access of processor A to the bus of processor B is terminated by a triggering. This may occur when, for example, the measured time interval 175 between the request signal 172 and the acknowledgment signal 174 overshoots or undershoots a user-defined time interval.

In the logic analyzer according to the present invention, time intervals between events in the data signals of a number of different targets are measured during a recording. Each data signal is scanned with an external clock signal which is derived from the corresponding target and is of unknown frequency.

The diagram shows that the logic analyzer according to the invention makes it possible to use the measured time intervals in a trigger control. As is apparent from FIG. 14, this is achieved even when the various external clock signals are in an asynchronous relationship to one another.

Figure 15:
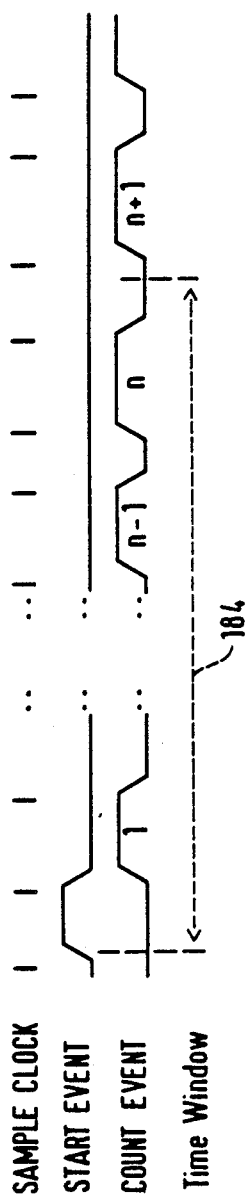
FIG. 15 is a signal diagram illustrating the timing involved in counting the number of events within or outside a time slot using an external target-derived clock of unknown frequency.

As shown by FIG. 15, a logic analyzer according to the present invention is used to record signal patterns which are sampled with an external target-derived clock signal 181. After the call-up of a subprogram when a start event signal 182 is pulsed, and during the recording of the signal patterns, a check is made whether a number n of data transfers (counting events) 183 have been made to an output register within a Particular time interval 184. The user defines beforehand the size of the time slot 184, the number n of data transfers (counting events) and how the trigger control is to react thereto. This figure shows that the present invention makes it possible to count the number of events within or outside a time slot, and to use this count result in a trigger control during a recording being made with an external target-derived clock of unknown frequency.

Figure 16:
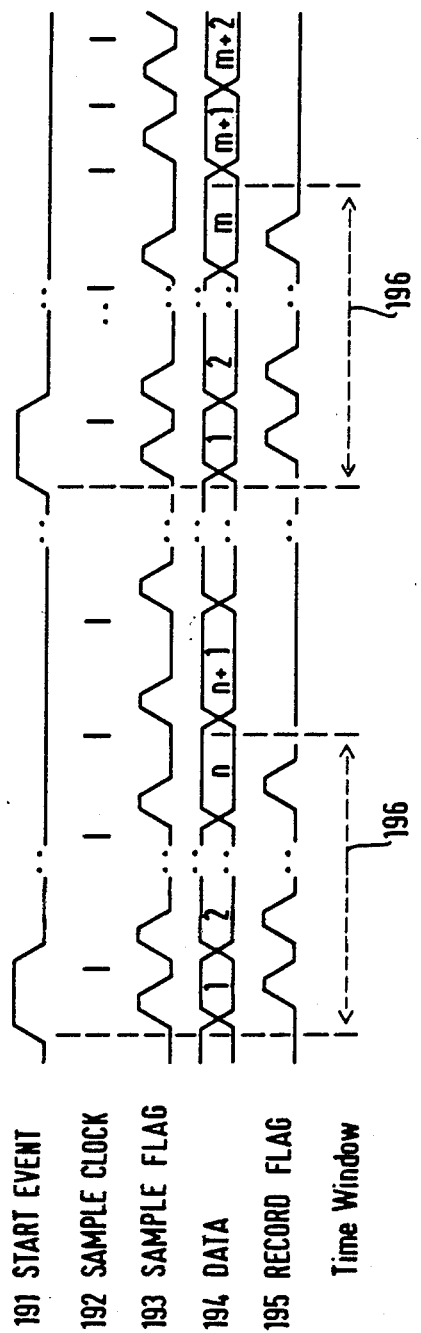
FIG. 16 is a signal diagram illustrating the recording of data signals occurring within a user defined time interval.

As shown by FIG. 16, a logic analyzer according to the present invention is used to record data signals 194 occurring within a time interval 196 each time a start event signal 191 pulses. The user defines the time interval 196 before the recording. As can be seen from FIG. 16 the data signals are sampled by an external target-derived clock signal 192. The sample-marking pulses 193 shown in FIG. 16 and the recording-marking pulses 195 are produced during the recording.

This example shows that the invention makes it possible, in a recording being carried out with an external target-derived clock signal of unknown frequency, to control the recording of the data signals by inputting sample data signals into the data memory 55 within or outside a time slot. In the known logic analyzers however, the transfer, and therefore the recording, of data signals being sampled by an external target-derived clock signal of unknown frequency can be controlled only by the presence of events.

On the basis of the signals stored in the data memories 55, and evaluated by the evaluator 41, the logic analyzer according to the invention can provide a time-correlated display of the recordings of data signals of a number of targets. These data signals can be sampled by an external target-derived clock signal of unknown frequency even when the various clock signals are in an asynchronous relationship to on another. The use of the time measurement circuit 45, hereinbefore described, and of the time memory makes it possible to display both the time sequence of the data signals and the quantitative time interval between samplings. In the case of known logic analyzers such recordings—i.e., the recordings of data signals of two different targets by clock signals in an asynchronous relationship to one another can be displayed only in the time sequence of their samplings. The known logic analyzers cannot make quantitative statements about the actual time interval between samplings. The logic analyzer described by the present invention allows such quantitative analysis.

What is claimed is:

1. A logic analyzer, characterized in that it has at least one acquisition module (24, 34) which can be connected to an associated target (21, 31) and which acquisition module comprises the following circuit arrangements:
   (a) clock selector means enabling the selection either of a constant-frequency internal clock signal or of an external clock signal derived from an associated target, selected clock signal appearing at the output of the sample clock signal;
   (b) sample register means to store data signals delivered by the target and sampled by the sample clock signal;
   (c) sample detector means which responds to the sample clock signal by delivering for each sampling as an output signal a sample signal from which the instant of time of sampling can be derived;
   (d) synchronizing circuit means comprising a synchronization register means for storing data signals read out of the sample register means in response to the sample clock signal and sampled by the internal clock signal, and logic circuit means responsive to the internal clock signal and to the sample signal for delivering sample marking pulses for marking sampling time;
   (e) event detector means for comparing data signals read out of the synchronization register means of the synchronization circuit means with a predetermined pattern and in the event of coincidence, for delivering an output signal corresponding to an event;
   (f) memory control means providing a logic link between control signals delivered by a trigger control means, one or more output signals of the event detector means and one or more sample marking pulses, for producing as output signal a recording marking pulse causing the storage of data signals which are read out of the synchronization register means in response to the internal timing signal and whose time position is marked by a corresponding sample marking pulse; and
   (g) data memory means controlled by the memory control means and operative to store data signals read out of the synchronization register means.

2. An analyzer according to claim 1, wherein there is a trigger control means, which by counting output signals of the event detector means, sample marking pulses and pulses of the internal clock signal, and by comparison of the resulting counter states with predetermined values, produces control signals supplied to the memory control means of the acquisition module.

3. An analyzer according to claim 1, wherein there is a time measurement circuit means, for measuring the time intervals between recording marking pulses, and a time memory means for storing the measured time intervals and the recording marking pulses marking the end of a measured time interval.

4. An analyzer according to claim 3, wherein there is an evaluator means for reading and processing after the termination of a measurement the data signals stored in the data memory means and the time intervals stored in the time interval memory means.

5. An analyzer according to claim 1, wherein there is at least two of said acquisition modules and a trigger control means common to each number of said modules.

6. An analyzer according to claim 5, characterized in that the trigger control means, by counting output signals of each event detector means corresponding to said modules, sample marking pulses and pulses of the internal timing signal and by comparison of the resulting counter states with predetermined values, produces control signals which are supplied to each corresponding memory control means of the acquisition modules.

7. An analyzer according to claim 5, wherein there is a time measurement circuit means, for measuring time intervals between recording marking pulses delivered by acquisition modules, and a time interval memory means, for storing measured time intervals and recording-marking pulses marking the end of a measured time interval.

8. An analyzer according to claim 7, wherein there is an evaluator means for reading and processing after termination of a measurement, data signals stored in the data memories means and time intervals stored in the time interval memory means.

* * * * *